United States Patent
Wang et al.

(10) Patent No.: US 6,569,253 B2
(45) Date of Patent: May 27, 2003

(54) METHOD OF CLEANING A CHAMBER OF A CVD MACHINE AND ELEMENTS WITHIN

(75) Inventors: Wei-Hsu Wang, Kao-Hsiung Hsien (TW); Tsan-Chi Chu, Hsin-Chu (TW); Cheng-Yuan Yao, Ping-Tung Hsien (TW); Wei-Hao Lee, Tai-Chung (TW); Ping-Chung Chung, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 191 days.

(21) Appl. No.: 09/841,010

(22) Filed: Apr. 25, 2001

(65) Prior Publication Data

US 2002/0157687 A1 Oct. 31, 2002

(51) Int. Cl.$^7$ ................................................. C23G 1/00
(52) U.S. Cl. ............................ 134/2; 134/3; 134/22.1; 134/22.17; 134/22.19; 134/26; 134/28; 134/29; 134/31; 134/36; 134/37; 134/41; 134/42

(58) Field of Search ................................ 134/2, 3, 22.1, 134/22.17, 22.19, 26, 28, 29, 31, 36, 37, 41, 42

(56) References Cited

U.S. PATENT DOCUMENTS

2002/0157687 A1 * 10/2002 Wang et al. .................... 134/3

\* cited by examiner

*Primary Examiner*—Sharidan Carrillo
(74) *Attorney, Agent, or Firm*—Winston Hsu

(57) ABSTRACT

The present invention provides a method of cleaning a chamber of a CVD machine and elements within. A gas mixture of carbon tetrafluoride ($CF_4$) and perfluoro ethane ($C_2F_6$) is first injected into the chamber. After performing a surface treatment, comprising a sandblasting step or a polishing step, on the surfaces of the elements, the elements are then immersed in a cleaning solution, comprising at least ammonia water ($NH_4OH$) and hydrogen peroxide ($H_2O_2$) at a temperature maintained between 40° C. to 70° C. Finally, the temperature of the cleaning solution is raised so that the residual layer on the surface of the elements can drop from the surfaces of the heater and the process kits or dissolve into the cleaning solution.

11 Claims, No Drawings

METHOD OF CLEANING A CHAMBER OF A CVD MACHINE AND ELEMENTS WITHIN

BACKGROUND OF THE INVENTION

1. Field of the Invention

The present invention relates to a method of cleaning a chamber of a chemical vapor deposition (CVD) machine and elements within, more specifically, to obtain a cost-effective solution for CVD machine maintenance.

2. Description of the Prior Art

Chemical vapor deposition (CVD) involves changing reactants to solid products through chemical reactions in a chamber, and is one of the most important tools commonly applied in the semiconductor industry. Films for conductors, semiconductors or dielectrics can all be produced by the CVD process. Since the CVD process involves producing films through chemical reactions among gas reactants, the crystallinity and the stoichiometry of the films are better than that of the films produced by sputtering.

Fluoro nitride ($NF_3$) is the default clean gas for the CVD machines made by AMAT, commonly used by semiconductor manufacturers. However, worldwide shortage of flouro nitride in recent years has forced manufacturers to turn to alternative gases such as carbon tetrafluoride ($CF_4$) and perfluoro ethane ($C_2F_6$). The end result of the CVD process is the production of a black residual layer that is coated on the surface of the heater and other process kits in the CVD chamber. As the manufacturing frequency and quantity increase, the residual layer becomes thicker so that stress error of the CVD machine occurs more frequently. As well, both the thickness and uniformity of the film produced by the CVD machine are affected.

The common solution to this problem is to adjust the parameters of the CVD machine and that of the process as compensation. However, a great deal of man-hour is needed for the adjustment to lead to the increase in the shutdown period of the CVD machine. Also, as the thickness of the residual layer increases to a certain amount, compensation through parameter adjustment is no longer feasible and replacement of the heaters are required. The current price for a new heater is approximately 40,000 U.S. dollars. Six heaters must be replaced each time, six times per year. In other words, an annual cost of more than 1.5 million U.S. dollars is spent on each CVD machine to solve the problem of the black residual layer. Thus, not only is significant cost required to maintain the CVD machine but also significant man-hours is needed for the daily adjustment of the CVD machine and process parameters to hinder operational management.

SUMMARY OF THE INVENTION

It is therefore a primary object of the present invention to provide a method of cleaning a chamber of a chemical vapor deposition (CVD) machine and elements within as a cost-effective solution for CVD machine maintenance.

In the present invention, a method of cleaning a chamber of a CVD machine and elements within is provided to save both cost and effort in the maintenance of CVD machines. In the preferred embodiment of the present invention, a CVD chamber comprises a heater and other process kits. Firstly, a gas mixture of tetrafluoride ($CF_4$) and perfluoro ethane ($C_2F_6$) is injected into the chamber. After a surface treatment, comprising a sandblasting step or a polishing step, is performed on the elements, the elements are then immersed in a cleaning solution comprising at least ammonia water ($NH_4OH$) and hydrogen peroxide ($H_2O_2$) of a temperature between 40° C. to 70° C. Finally, the temperature of the cleaning solution is raised so that the residual layer on the surface of the elements can drop from the surfaces of the heater and the process kits or dissolve into the cleaning solution.

It is an advantage of the present invention over the prior art that the cleaning method of the present invention can efficiently reduce the maintenance cost for CVD machines. As well, the residual layer coated on the surfaces of the heater and the process kits can be completely removed without requiring a great deal of man-hours and effort spent on parameter adjustment of the CVD machine and that of the process. Therefore, the shutdown period of the CVD machine can also be significantly reduced.

These and other objectives of the present invention will no doubt become obvious to those of ordinary skill in the art after reading the following detailed description of the preferred embodiment, which is illustrated in the multiple FIGS. and drawings.

DETAILED DESCRIPTION OF THE PREFERRED EMBODIMENT

A chemical vapor deposition (CVD) machine, being a plasma-enhanced chemical vapor deposition (PECVD) machine or a sub-atmospheric chemical vapor deposition (SACVD) machine, comprises a chamber and the elements, including a heater and other process kits, within the chamber.

A gas mixture of carbon tetrafluoride ($CF_4$) and perfluoro ethane ($C_2F_6$) is first injected into the chamber. A surface treatment, comprising a sandblasting step or a polishing step, is then performed on the elements. The elements are thereafter immersed in a cleaning solution, comprising at least ammonia water ($NH_4OH$), with a concentration range of 14% to 40%, and hydrogen peroxide ($H_2O_2$), with a concentration range of 50% to 67%, at a temperature maintained between 40° C. to 70° C. Finally, the temperature of the cleaning solution is raised so that the residual layer on the surface of the elements can drop from the surfaces of the heater and the process kits or dissolve into the cleaning solution.

The cleaning solution can also be prepared by mixing hydrofluoric acid (HF) and ammonia water ($NH_4OH$) at a ratio of 1:1 to 3:1 at a temperature maintained between 40° C. to 70° C.

In comparison with the heater replacement according to the prior art, the cleaning method provided in the present invention can completely remove the residual layer coated on the surfaces of the heater and the process kits without spending a great deal of man-hours and effort on parameter adjustment of the CVD machine and that of the process. As well, the shutdown period of the CVD machine can be significantly reduced. Furthermore, the method of cleaning a chamber of a CVD machine and elements within according to the present invention efficiently reduces the annual maintenance cost of approximately 1.5 million U.S. dollars for each CVD machine.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of cleaning a chamber of a chemical vapor deposition (CVD) machine, the method comprising the steps of:

providing a chamber of a chemical vapor deposition (CVD) machine, the chamber comprising a heater therein;

injecting carbon tetrafluoride ($CF_4$) and perfluoro ethane ($C_2F_6$) gas mixtures into the chamber to remove portions of a residual layer on the heater; and immersing the heater in a cleaning solution to completely remove the residual layer on the heater, the cleaning solution comprising ammonium hydroxide ($NH_4OH$) and hydrogen peroxide ($H_2O_2$).

2. The method of claim 1 wherein the chemical vapor deposition machine is a plasma-enhanced chemical vapor deposition (PECVD) machine, or a sub-atmospheric chemical vapor deposition (SACVD) machine.

3. The method of claim 1 wherein the temperature of the cleaning solution is maintained between 40° C. to 70° C.

4. The method of claim 1 wherein a surface treatment is performed on the heater prior to the immersion step.

5. The method of wherein claim 4 wherein a surface treatment Comprises a Sandblasting step or a polishing step.

6. A method of cleaning a chamber of a chemical vapor deposition (CVD) machine, the method comprising the steps of:

providing a chamber of a chemical vapor deposition (CVD) machine, the chamber comprising a heater therein;

injecting carbon tetrafluoride ($CF_4$) and perfluoro ethane ($C_2F_6$) gas mixtures into the chamber to remove portions of a residual layer on the heater; and immersing the heater in a cleaning solution to completely remove the residual layer on the heater, the cleaning solution comprising hydrofluoric acid (HF) and ammonium hydroxide ($NH_4OH$).

7. The method of claim 6 wherein the chemical vapor deposition machine is a plasma-enhanced chemical vapor deposition (PECVD) machine, or a sub-atmospheric chemical vapor deposition (SACVD) machine.

8. The method of claim 6 wherein the temperature of the cleaning solution is maintained between 40° C. to 70° C.

9. The method of claim 6, wherein a surface treatment is performed on the heater prior to the immersion step.

10. The method of claim 6 wherein the proportion of hydrofluoric acid to ammonium hydroxide in the cleaning solution is 1:1 to 3:1.

11. The method of claim 9 wherein the surface treatment comprises a sandblasting step or a polishing step.

* * * * *